United States Patent [19]
Morris

[11] Patent Number: 5,348,935
[45] Date of Patent: * Sep. 20, 1994

[54] HIGHLY OXIDIZED SUPERCONDUCTORS

[75] Inventor: Donald E. Morris, Kensington, Calif.

[73] Assignee: The Regents of the University of California, Oakland, Calif.

[*] Notice: The portion of the term of this patent subsequent to Jun. 18, 2008 has been disclaimed.

[21] Appl. No.: 890,346

[22] Filed: May 22, 1992

Related U.S. Application Data

[60] Continuation of Ser. No. 560,475, Jul. 27, 1990, abandoned, Division of Ser. No. 385,608, Jul. 26, 1989, abandoned, which is a continuation-in-part of Ser. No. 263,750, Oct. 28, 1988, abandoned.

[51] Int. Cl.$^5$ .................. H01B 1/08; H01B 12/00
[52] U.S. Cl. .................. 505/482; 505/742; 252/518; 252/521
[58] Field of Search ............ 505/1, 742; 252/518, 252/521

[56] References Cited

U.S. PATENT DOCUMENTS 5,024,992  6/1991  Morris ........................... 505/1

FOREIGN PATENT DOCUMENTS 0297203 12/1988 Japan ................................. 505/742

OTHER PUBLICATIONS

Bordet et al., *Nature* (1988) 335:596–598.
Karpinski et al., *Nature* (1988) 331:242–245.
Karpinski et al., *Physica C* (1988) 153-155:401–402.
Karpinski et al., *Physica C* (1988) 153-155:830–831.
Cava et al., *Nature* (1989) 338:328–330.
Marsh et al., *Nature* (1988) 334:141–143.
Karpinski et al., *Nature* (1988) 336:660–662.
Morris et al., *Physica C* (1989) 159: 287–294.
Morris et al., *Phys. Rev. Lett.* (1989) 39:7347–7350.
Viegers et al., *J. Mater. Res.* (1987) 2:743–749.
Narayan et al., *Appl. Phys. Lett.* (1987) 51:940–942.
Zandbergen et al., *Nature* (1988) 331:596–599.
Kogure et al., *Physica C* (1988) 156:35.
Marshall et al., *Phys. Rev. B* (1988) 37:9353–9358.
Kwo et al., *Appl. Phys. Lett.* (1988) 52:1625–1627.
Char et al., *Phys. Rev. B* (1988) 38:834–837.
Mandich et al., *Phys. Rev. B* (1988) 38:5031–5034.
Kogure et al., *Physica C* (1988) 156:45–56.
Schneemeyer et al., *Nature* (1987) 328:601.
Gallager, *Adv. Ceram. Mater.* (1987) 2:632.
Kishio et al., *Jpn. J. Appl. Phys.* (1987) 26:L1228.
Specht et al., *Phys. Rev. B* (1988) 37:7426–7434.
Tarascon et al., *Science* (1987) 235:1373–1376.
Beille et al., *Physica* (1987) 146B:307–311.
Demazeau et al., *Physica C* (1988) 153-155:824–825.
Torrance et al., *Phys. Rev. Lett.* (1988) 61:1127–1130.
Tarascon et al., MRS Symposium S, Spring 1987 (Material Research Soc., Pittsburgh, Pa., 1987) vol. EA-11, pp. 65–67, Apr. 25, 1987.
Tarascon et al., *Phys. Rev. B* (1987) 36:226–234.
Terada et al., *Physica C* (1988) 153-155:976–977.
Robinson et al., *Mat. Res. Soc. Symp. Proc.* (1988) 99:587–590.
Uno et al., *Jap. J. Appl. Phys.* (1988) 27:L1003-L1006.
Hazen et al., (1989) *Applied Phys. Lett.* 54:1057–1059.
Shannon, *Acta Crystallog* (1976) A32:751–767.
Johnston, *High Tc Update* (1989) 3:1.
J. Karpinski, personal communication; report at Material Research Society Spring Meeting, Apr. 1989.

(List continued on next page.)

Primary Examiner—Paul Lieberman
Assistant Examiner—M. Kopec
Attorney, Agent, or Firm—Townsend and Townsend Khourie and Crew

[57] ABSTRACT

Novel superconducting materials in the form of compounds, structures or phases are formed by performing otherwise known syntheses in a highly oxidizing atmosphere rather than that created by molecular oxygen at atmospheric pressure or below. This leads to the successful synthesis of novel superconducting compounds which are thermodynamically stable at the conditions under which they are formed.

16 Claims, 4 Drawing Sheets

OTHER PUBLICATIONS

Dabrowski and Hinks, (1988) Proc. 2nd Ann. Conf. on Supercon. and App., p. 141 (Apr. 18–20, Buffalo, N.Y.), Elsevier Science Pub. Co., N.Y.

Wei-Chen "Structural Behavior and Superconductivity of $YBa_2Cu_3O_x$," *Solid State Comm* vol. 63 (11) Sep. 1987 pp. 997–1001.

Takeda "Structure and Properties of Yttrium Larium Strotium . . . " *Physica C* vol. 157 (2) 1989 no month available pp. 358–364 (Abstract Only).

Shimada "Synthesis of Superconducting barium yttrium copper-oxides" Kagaku Kogyo vol. 38 (12) 1987 no month available pp. 1014–1021 (Abstract Only).

Hepp "Advantages of Barium peroxide in the powder . . . " *Mat Res Soc Symp Proc* vol. 99 Dec. 1987 pp. 615–618.

Saito "Properties of the Superconductor (Sr,Ca)–Ca–Cr–O . . . " *Jnp. Jnl. Appl. Phys.* vol. 26 (4) Apr. 1987 p. L366–367.

Sato "$YBa_2Cu_3O_x$ annealed under High-pressure oxidizing . . . " *Jap. Jnl. Appl. Physics* vol. 27 (6) Jun. 1988 pp. L1047–1049.

Chen "Superconductivity and the tailoring of lattice . . . " A. J. Ceramic Materials vol. 2 (No. 2B) Jul. 1987, pp. 457–469.

Uno "Synthesis of Superconductive Oxides by Vacuum . . . " *Jap. Jul. Appl. Phys.* vol. 27 (6) Jun. 1988, pp. L1003–1006.

Ramakrishna "Low-field microwave absorption . . . " *Mat. Res. Soc. Sym. Proc.* vol. 99 Nov./Dec. 1987 pp. 455–458.

Cava "Bull Superconductivity at 191 K in Single–Phye" *Physical Rev. Lett.* vol. 58 No. 16 Apr. 20, 1987 pp. 1676–1679.

Engler "Superconductivity above liquid nitrogen temperature . . . " *J. Am. Chem. Soc.* vol. 104 1987 pp. 2848–2849.

Qadri "X-ray identification of the superconducting . . . Y–Ba–Cu–O System" *Phys. Rev. B* vol. 35 (13) May 1, 1987 pp. 7235–7237.

Umarji "Effect of nominal copper concentration in $YBa_2Cu_{3/x}O_{7-8}$ . . . " *Pramana–J. Phys.* vol. 29(6) Dec. 1987 pp. L611–L614.

Beno et al., *Appl. Phys. Lett.* (1987) 51:57–59.

Capponi et al., *Europhys. Lett.* (1987) 3:1301–1307.

Rao et al., *Japanese J. of Applied Physics,* vol. 26 (1987) Supplement 26–3.

Frase and Clarke, *Advanced Ceramic Materials,* vol. 2, No. 3B, Special Issue (1987), 295–302.

HIGHLY OXIDIZED SUPERCONDUCTORS

The invention described herein arose in the course of or under Contract No. DE-AC03-76-SF-00098 between the Department of Energy and the University of California at Berkeley.

This is a continuation of application Ser. No. 560,475, filed Jul. 27, 1990, now abandoned which is a division of application Ser. No. 385,608, filed Jul. 26, 1989, now abandoned which application is a continuation-in-part of U.S. application Ser. No. 07/263,750 filed on Oct. 28, 1988 now abandoned, and naming Donald E. Morris as the sole inventor. The entire disclosure of that related application is incorporated herein by reference.

BACKGROUND OF THE INVENTION

Theoretical and experimental research in the field of superconducting materials by thousands of researchers has led to the discovery of a handful of oxide compounds which become superconducting at relatively high temperatures ($T_c$), i.e., within the range of 40–126K. All of the known high temperature superconductors are oxides, and contain (1) copper and/or bismuth, (2) barium or other alkaline earths such as strontium or calcium, and (3) trivalent elements such as yttrium. Rare earth elements 57 to 71 (lanthanum to lutecium), thallium or bismuth are substituted for yttrium in some materials. Notable superconductors are as follows:

(1) oxide materials containing lanthanum, strontium and copper, bearing the formula $La_{2-x}Sr_xCuO_4$, commonly referred to as L-S-C-O;

(2) oxide materials containing yttrium, barium and copper, bearing the formula $YBa_2Cu_3O_{7-\delta}$, commonly referred to as 1-2-3 (rare earth elements can be substituted for yttrium, and the resulting compounds are also superconducting);

(3) oxide materials containing bismuth, strontium, calcium and copper, bearing such formulas as $Bi_2CaSr_2Cu_2O_{8+x}$, commonly referred to as B-C-S-C-O;

(4) oxide materials containing thallium, barium, calcium and copper, bearing such formulas as $Tl_2Ba_2CuO_x$, $Tl_2CaBa_2Cu_2O_x$, $Tl_2Ca_2Ba_2Cu_3O_x$, $Tl_2Ca_3Ba_2Cu_4O_x$, $TlCaBa_2Cu_2O_x$, and $TlCa_2Ba_2Cu_3O_x$, commonly referred to as T-C-B-C-O; and (5) oxide materials containing bismuth, barium, potassium and copper, bearing the formula $Ba_{1-x}K_xBiO_3$, identified as B-K-B-O.

Each of these high temperature superconducting materials has drawbacks. For example:

$La_{2-x}Sr_xCuO_4$ has a $T_c$ of only 40K.

$YBa_2Cu_3O_{7-\delta}$ has an oxygen content which varies with temperature, and is only superconducting when the oxygen content is high ($\delta < 0.4$). A unique feature of the 1-2-3 compound is the variable oxygen stoichiometry, and rapid and reversible oxidation/reduction above 400° C. Changing the oxygen content changes the superconducting transition temperature $T_c$ and also the normal state resistivity. The required high oxygen content is only reached in equilibrium at low temperatures (~400° C.). At relatively high temperatures, the oxygen content of the crystal structure has an equilibrium value which is lower than the equilibrium value at lower temperatures. Temperature changes encountered during the processing of this material thus brings about changes in chemical composition and crystal structure, occurring slowly and nonuniformly. At the high temperatures needed for synthesis, grain growth and densification, the oxygen loss is severe, and is frequently accompanied by the formation of a liquid phase and the reordering of the crystal structure to segregate the material into two solid phases as the liquid phase resolidifies. The presence of two phases of different crystal structure and empirical composition is detrimental to the uniformity of atomic structure near grain boundaries and introduces certainty and nonuniformities in the critical temperature. In addition, above about 700° C., with loss of oxygen, the structure changes from orthorhombic to tetragonal. During cooling after synthesis, the structure changes back to orthorhombic as oxygen is absorbed. The existence of two phases gives rise to internal stresses in the material during cooling, causing twinning and its associated detrimental effects.

B-C-S-C-O has a soft flaky structure, while T-C-B-C-O contains highly toxic thallium. B-K-B-O is extremely sensitive to moisture and decomposes readily. In addition, B-K-B-O has a very low $T_c \simeq 30K$.

Materials (1), (2), (3) and (4) all contain copper as an essential constituent. The copper in these materials is in a highly oxidized state, with a formal valence greater than $+2$. This means that either some of the copper is in the rare trivalent state, or the oxygen is of a valency smaller than the normal $-2$.

The need for additional high temperature superconductors is great, not only to achieve superconductors with higher $T_c$'s, but also to achieve superconductors with improved mechanical properties, stability and ease of processing. The discovery and study of new high temperature superconductors varying in composition and structure also provides the benefit of insight into the superconducting phenomenon, which will aid in finding a theoretical explanation. This will lead to a more systematic design of superconductors with needed properties.

SUMMARY OF THE INVENTION

It has now been discovered that novel superconducting materials in the form of compounds, structures or phases are formed by carrying out the synthesis in atmospheres which are highly oxidizing, i.e., having a substantially stronger oxidizing potential than an atmosphere of 100% molecular oxygen at atmospheric pressure. Such highly oxidizing atmospheres are achieved by molecular oxygen at superatmospheric pressures, by ozone at substantially any pressure, preferably atmospheric or superatmospheric, by atomic oxygen generated in a variety of ways at substantially any pressure, preferably atmospheric or superatmospheric, by any compound which generates oxygen at oxidation potentials comparable to those created by the above systems, or by electrochemical oxidation.

It is well known that superconducting cuprates are all very highly oxidized compounds. All have copper in a valency higher than $+2$. For example, in the original $La_{2-x}Sr_xCuO_4$ superconductor, the average valency of Cu is 2.15, while in $YBa_2Cu_3O_x$, the average Cu valency is 2.33.

In accordance with the present discovery, when an oxide is heated, it tends to lose oxygen to its environment. Oxides therefore tend to be partially reduced by heating to high temperature, and compounds with relatively low oxygen content will be formed at high temperatures. This is particularly true when the metal has more than one possible valency. The reduction in oxygen content can be prevented by reacting the constituent metal oxides in high pressure oxygen. This will thermodynamically favor the formation of highly oxidized compounds or structures.

The present discovery leads to the expectation that many new superconductors will be discovered by the use of high pressure oxygen in the synthesis procedure, since this favors the formation of highly oxidized phases.

One result of the present discovery is the successful synthesis of novel superconducting compounds. It has been found that when powdered oxides of barium and copper in combination with a third metal are intimately mixed and then heated in high pressure oxygen to an elevated temperature, they will react to form superconducting compounds with novel composition, structure and properties. The new compounds are thermodynamically stable under the conditions of temperature and oxygen pressure at which they are formed. In addition, however, the new compounds and structures are substantially nonsusceptible to variations in the oxygen content when subjected to changing temperatures, thereby forming a temperature-stable substantially single phase crystal.

In one embodiment of the invention, the invention resides in superconducting materials having the empirical formula $RBa_2Cu_4O_8$, where R is either yttrium or a rare earth metal, and this material is formed by heating the metals or compounds of the various metals involved, which compounds may each contain one or more than one metal and may themselves be insulating or conductive or superconductive, in an oxygen-containing atmosphere at elevated pressure, substantially in excess of 1 atmosphere, at a temperature and time sufficient for interdiffusion and substantially uniform crystal formation to take place. In an alternative embodiment, the superconducting material will have the empirical formula $R_2Ba_4Cu_7O_{15}$. The term "oxygen-containing atmosphere" is intended to include any gas or mixture of gases containing molecular oxygen. The term "substantially single phase lattice structure" is intended to include at most minor amounts of other phases of differing empirical formula, i.e., amounts which will have anything more than a negligible effect on the superconducting character of the material as a whole. The term as used herein is intended to include polycrystalline structures, i.e., grain networks where each grain is substantially identical in its empirical formula and crystalline lattice array.

Five new high temperature superconducting compounds $R_2Ba_4Cu_7O_{15}$ (R=Eu, Gd, Dy, Ho, Er) are synthesized in oxygen at moderate pressures above 1 bar. Each 2-4-7 compound is stable only within a range of oxygen pressures bounded by the stability regions of the 1-2-4 and 1-2-3 phases. The required $P(O_2)$ varies with temperature and rare earth (RE) ion radius. The $T_c$'s (measured by Meissner diamagnetism) are 55K–45K, and vary inversely with ion size (as in 1-2-4). The basal plane areas are larger and orthorhombic distortions smaller than the corresponding 1-2-3 and 1-2-4, suggesting weaker bonding in the $CuO_2$ layers. The 2-4-7 phase has variable oxygen stoichiometry and $T_c$ decreases when oxygen is removed.

It has also been found in the 1-2-4 compound that barium may be partially substituted by strontium and/or calcium. The same is expected of the 2-4-7 compounds.

Under appropriate conditions of oxygen pressure and temperature, a different novel compound is formed. In this embodiment of the invention, the compound has the empirical formula $R_2Ba_4Cu7O_x$, with $T_c \approx 50K$.

This invention is not limited to the constituent elements of the 1-2-3 material, but is of general application to the synthesis of high temperature oxide superconductors.

One embodiment of the present invention is a material possessing superconducting properties having approximately the empirical formula:

$$R_2M'_4M''_7O_x$$

wherein
R is a rare earth metal or yttrium;
M' is a combination of one or more Group II elements;
M'' is a combination of one or more metallic elements having a plurality of valence states; and
x is less than about 16.

Typically, this material will be in a substantially polycrystalline bulk ceramic form or substantially a single phase lattice structure.

The R is preferably selected from the group of yttrium, europium, gadolinium, dysprosium, holmium and erbium. The M' component is preferably selected from the group barium, strontium, calcium, magnesium, cadmium or a mixture of them. The M'' component is selected from the group of copper, palladium, silver, bismuth or a mixture of them.

The mixture for heating to produce the superconducting compound will comprise compounds containing the elements Li, Na, Mg, K, Ca, Sc, Ti, Al, Ga, Rb, Sr, Y, Zr, Nb, Ru, Rh, Pd, Ag, Cd, In, Sn, Sb, Cs, Ba, La, Hf, Os, Ir, Tl, Pb, Bi, Ce, Pr, Nd, Pm, Sm, Eu, Gd, Tb, Dy, Ho, Er, Tm, Yb, Lu, Th, U or some mixture of them.

The present invention also provides a method for producing a superconducting material by a solid state method. This method comprises heating a mixture with at least one metal element having a plurality of valence states to at least 200° C. in an environment having an oxidizing potential greater than that of molecular oxygen at about one atmosphere partial pressure. This environment having an oxidizing potential greater than that of molecular oxygen at one atmosphere partial pressure will typically comprise (i) about 100% molecular oxygen at a partial pressure in excess of about one atmosphere, (b) ozone at a partial pressure at least about 50 millibar, (c) atomic oxygen at a partial pressure at least about 10 millibar or (d) a combination of (a), (b) or (c). Preferably, this will be (a) 100% molecular oxygen at a partial pressure greater than about three atmospheres, (b) ozone at a partial pressure greater than about 500 millibar, (c) atomic oxygen at a partial pressure greater than about 200 millibar or (d) a combination of (a), (b) or (c).

The heating step will typically be to a temperature of at least about 500° C. for at least about ½ hour, preferably to a temperature of at least about 800° C. for at least about 1 hour, and most preferably under the combined conditions of partial pressure for an oxidizing agent and to a temperature at which a desired superconductor compound product is thermodynamically stable. The heating step will preferably be performed for a sufficient period of time for oxygen atoms to equilibrate at the center of said mixture.

Another aspect of the present invention is a further step of slow cooling of the heated mixture at a rate slower than about 20° C./min. This will typically be combined with the condition of cooling under elevated oxidizing potential partial pressures. In some embodiments, this cooling of said mixture is substantially controlled as to temperature and pressure to continuously correspond to an oxidizing reagent partial pressure and a temperature at which a resultant desired superconductor compound is thermodynamically stable, although such is not required so long as the cooling is done relatively rapidly.

Advantages of the present invention include the fact that the material can be prepared in thermodynamic equilibrium as bulk polycrystalline material, single crystals or thin films, rather than being formed as one phase in a structure containing multiple phases which cannot be isolated by practical means, and the fact that the material can be processed under a wide range of conditions with substantially no change in its superconducting properties.

Further features and advantages of the invention will become apparent from the description which follows.

DETAILED DESCRIPTION OF THE INVENTION AND PREFERRED EMBODIMENTS

The present invention is applicable to superconductor materials which contain or are fabricated from metals or metal oxides. Preferred metals have several valence states. Among these, copper and bismuth are particularly preferred.

These metals or metal oxides may be combined with other metals or metal oxides. Preferred among the latter are the divalent metals barium, strontium, calcium and cadmium, and other metals which also possess large electric polarizabilities, and trivalent metals such as yttrium, scandium, bismuth, thallium, transition metals, and the rare earth elements (lanthanum through lutecium). Preferred among the rare earth elements are neodymium, samarium, europium, gadolinium, dysprosium, holmium, erbium and thulium.

The metals used in the process by which the superconducting materials of the present invention are prepared may be in the form of the metals themselves, their oxides, nitrates, carbonates, oxalates, tartrates, and any other form which yields the oxide upon heating in oxygen.

The metals used in the process may also be in the form of mixed oxides or compounds, that is to say, compounds each of which incorporate more than one of the metals. In the preferred embodiment, the metal oxides are chosen to be in a chemical and physical form which will render them highly reactive at elevated temperatures. This may include use of finely divided oxides to provide large surface energies and chemical forms such as peroxides, carbonates, nitrates, or mixed oxides which have lower chemical binding energy than the desired product or than other possible compounds which can be formed from the metals or metal oxides. Oxides are preferred. In the case of barium, the preferred compounds are $BaO$ and $BaO_2$. In the case of copper, the preferred form is $CuO$. The other metals are generally preferred to be in their oxide form, a prominent example being yttrium oxide $Y_2O_3$. The metal compounds are combined in relative amounts such that the atomic ratio of the metals is approximately the same as that of the superconductor to be formed. For example, when the desired compound is $YBa_2Cu_4O_8$, the yttrium, barium and copper metals are combined in the ratio 1:2:4.

The nomenclature used herein, X1-X2-X3, refers to the stoichiometric ratios of components. Such a designation is applied to a substance with the empirical formula $$R_{x1}M'_{x2}M''_{x3}O_x,$$

where
R is an element which may exist in a form with a valence of +3,
M' is an element which may exist in a form with a valence of +2 and
M'' is an element which may exist in a plurality of valence states.

Mixtures comprising different similar valence elements may be used instead of pure elements. For the superconductors described herein, usually R is a rare earth or yttrium, M' is barium, M'' is copper and x is greater than 5. For example, as described above, the compound $$Y_1Ba_2Cu_3O_{7+\delta},$$

where δ is a small fraction, is referred to as a 1-2-3 compound.

As an alternative, the metals or oxides can be combined by applying them in an intimate mixture as a coating on a suitable substrate to form a film on the substrate. This may be done by high vacuum evaporation, plasma coating, decomposition of organometallics, laser ablation coating or other known coating methods. As another alternative, if 1-2-4, for example, is desired, a superconducting film of the 1-2-4 compound may be formed on a substrate of the 1-2-3 compound or another compound containing one or more of the constituent metals of the 1-2-4 compound by heating the substrate in concentrated or high pressure oxygen. In this case no film deposition at all is required if all of the constituents of the desired superconductor are incorporated in the substrate. The procedure may be reversed, and a film of the 1-2-3 superconductor may be formed on the surface of a 1-2-4 substrate by heating in an environment lacking high pressure or concentrated oxygen. Further-more, patterning of films with different compounds being formed in different regions or through the thickness of the film may be achieved by heating the film while exposing only part of it to the appropriate oxygen environment. The resulting film is then heat treated in the following manner.

The general procedure for heating the constituent materials in accordance with the present invention is one involving an environment containing concentrated and/or active oxygen. The term "active oxygen" is intended to mean atomic oxygen or ozone.

Another means included in the scope of this invention to supply oxygen to form highly oxidized superconductive compounds is by oxygen which is incorporated in a chemical compound which will release it to aid in formation of a second highly oxidized compound which is a superconductor. Such oxygen supplying compounds include but are not limited to peroxides or nitrates of the constituent metals. They also include other highly oxidized compounds which may themselves be superconductors. The constituent materials of the compound which is to be formed may be placed in contact with or mixed intimately with the compound which is to act as a source of oxygen.

A further means included within the scope of the invention to supply oxygen to form highly oxidized superconductive compounds is by means of electrical current such as in an electrochemical cell containing a suitable electrolyte such as, for example, $ZrO_2$ which provides oxygen or oxygen ions to a substance placed in close proximity or in contact with it when electrical current is passed. This and the preceding means may reduce or eliminate the need for elevated temperature for synthesis of the desired compound.

The preferred procedure for heating the constituent materials in accordance with the present invention is one involving an oxygen-containing atmosphere at high temperature and high pressure. The oxygen-containing atmosphere is either a gas or a mixture of gases which contains molecular oxygen ($O_2$) or ozone ($O_3$) or atomic oxygen. Molecular oxygen is preferred. When molecular oxygen is used, the gas mixture is preferably at least about 50% molecular oxygen, more preferably at least about 90% oxygen, and most preferably substantially 100% molecular oxygen. With molecular oxygen, the pressure is substantially superatmospheric. In some embodiments, the pressure will be at least about 2 atmospheres, at least about 10 atmospheres, or at least about 60 atmospheres, depending on the range of temperature dependent stability of the compound to be synthesized.

The temperature and heating time may vary, depending on the materials used. Higher temperatures will generally require less heating time.

In preferred embodiments, the heating is done at a temperature of at least about 700° C. for at least one hour, more preferably at least about 900° C. for about 10 hours.

The term "solid state method" herein refers to a controlled process of heating and cooling a mixture comprising metals and/or metallic oxide compounds whose bulk atomic stoichiometry approaches the desired non-oxygen proportions of the product superconducting material desired. This heating is performed for a sufficient period of time to approach thermodynamic equilibration of oxygen with the entire sample and at a combined temperature and oxygen partial pressure at which the desired superconductor product is thermodynamically stable. Typically, the desired superconductor will be of the 1-2-4 or the 2-4-7 type. In addition, the stoichiometry of the metals need not be precisely correct, and certain levels of atomic substitutions may also be incorporated. Oxygen containing materials may also be included. The cooling step will typically be a slow cooling of less than about 20° C./min, preferably less than about 10° C./min and most preferably much slower. During this cooling phase, the oxygen partial pressure is preferably controlled to stay substantially within the ranges where the desired product is thermodynamically stable. Typically, these combined conditions will be more critical at the higher temperatures at which oxygen diffusion into the sample core is faster. Alternatively, the heated sample may be cooled sufficiently rapidly that a metastable superconducting compound will not convert to any other during the cooling process.

The term "single phase lattice structure" herein refers to a compound which has a substantially homogeneous lattice structure. Typically, the homogeneity may be monitored by X-ray diffraction or nuclear diffraction techniques.

The term "polycrystalline bulk ceramic form" herein refers to a bulk form of a superconducting compound, in contrast to a thin-layer form. This bulk form typically has at least one crystal class.

The following examples are offered primarily for purposes of illustration, and are intended neither to limit nor define the invention in any manner.

EXAMPLES

EXAMPLE 1

1-2-4 COMPOUNDS

Polycrystalline materials bearing the empirical formula $R_1Ba_2Cu_4O_x$ where R is Y, Nd, Sm, Eu, Gd, Dy, Ho, Er, and Tm were prepared as follows. Stoichiometric quantities of R oxide, BaO, and CuO powders (all 99% or better) were mixed thoroughly and pressed at 25 kg/mm$^2$ into 6 mm diameter pellets, which were calcined in oxygen held at 120 atmospheres pressure for 7 hours at 930° C. The reacted mixtures were then cooled at 5° C. per minute to 700° C., 2° C./min to 600° C., 1° C./min to 500° C., 0.5° C./min to 450° C., 1° C./min to 390° C., and furnace cooled at about 4° C./min. The mixtures were then finely ground with an agate mortar and pestle, pressed into 6-mm-diameter tablets at 25 kg/mm$^2$, and sintered in oxygen at the same temperature, pressure and time schedule as used for the calcining. In the case of the Ho, Er and Tm compounds, the calcining and sintering were both carried out at 60 atmospheres pressure at a maximum temperature of 980° C. Cooling rates were the same as described above. The pellets were wrapped in gold foil before the calcining and sintering operations were carried out; no reaction with the gold was observed. It was found that if the constituent oxides are mixed in the 1-2-3 stoichiometry instead of the 1-2-4 stoichiometry and then the process given in the first example herein is carried out, the result is the formation of the desired 1-2-4 compound along with residual phases which incorporate the excess Y and Ba oxides which are left over. Conversion of the 1-2-3 compound to the 1-2-4 compound by heating in high pressure oxygen is more sluggish than formation from the constituent oxides. This is also true for conversion of 1-2-4 into 1-2-3 by heating at low oxygen partial pressure.

The structures of the products were confirmed as single phase polycrystalline structures by transmission electron microscopy and x-ray powder diffraction. X-ray powder diffraction was performed on a Scintag automated powder diffractometer using Cu $k_\alpha$ radiation. Diffraction patterns of each of the samples were examined for evidence of the superconducting phases 1-2-4, 2-4-7 and/or 1-2-3, as indicated by the presence of peaks at approximately 13.6 Å and 11.5 Å, respectively. For each of the samples that showed the 1-2-4 structure as the major phase, unit cell parameters were refined by the Reitveld method, assuming space group Ammm and the model structure reported in P. Marsh, et al., *Nature* 334, 141 (1988). These studies indicated that the atomic structure of the 1-2-4 phases was consistent with that of Marsh, et al. The lattice parameters are given in Table 1.

Diffraction peaks appearing at about 12.55 Å are interpreted to be the 004 reflection of compounds with 2-4-7 structure. The lattice parameters of the 1-2-4 phase were determined by refining together with the 1-2-4 phase, with the results shown in Table 1. Although the 2-4-7 phase contains 1-2-3 blocks, axial ratios are even smaller than the corresponding 1-2-4 compounds. Also, the c axes of the 2-4-7 compounds are shorter than the sum of the corresponding 1-2-3 and 1-2-4 compounds, giving unit cell volumes approximately 0.6% smaller, and indicating larger Madelung energies. The same is true for $Y_2Ba_4Cu_7O_x$, according to the lattice parameters given by Bordet, P., et al., *Nature* 334, 308 (1987) which is incorporated herein by reference for all purposes, and using the values for $YBa_2Cu_4O_8$ from Table 1.

Nearly pure polycrystalline materials bearing the

TABLE 1

SUPERCONDUCTING AND STRUCTURAL PARAMETERS OF $RBa_4Cu_4O_8$ COMPOUNDS

| R | Superconducting Parameters | | | Phases Present | | | Lattice Parameters of 1-2-4 [2-4-7] Phase | | | | |
|---|---|---|---|---|---|---|---|---|---|---|---|
| | $T_C(K)$ | $\chi_{20\ K}$ | $4\pi\rho\chi_{20\ K}$ | 1-2-3 | 2-4-7 | 1-2-4 | a (Å) | b (Å) | c (Å) | V (Å) | b/a |
| Y | 80.5 | −25 | 20% | no | no | all | 3.8395(2) | 3.8703(2) | 27.231(1) | 404.7 | 1.0080 |
| Nd | 57 | −3.5 | 3% | trace | no | minor | | | ~27.3 | | |
| Sm | 70 | −11 | 10% | 70% | no | 30% | 3.872(1) | 3.886(1) | 27.308(5) | 410.9 | 1.0036 |
| Eu | 68.5 | −24 | 21% | no | 40% | 60% | 3.8650(6) | 3.8837(5) | 27.279(4) | 409.5 | 1.0048 |
| | [~40] | [−10] | [9%] | | | | [3.879(2)] | [3.886(1)] | [50.39(3)] | [759.6] | [1.0018] |
| Gd | 73 | −18 | 16% | no | 60% | 40% | 3.867(1) | 3.881(1) | 27.26(1) | 409.1 | 1.0036 |
| | [−40] | [−9] | [8%] | | | | [3.868(2)] | [3.882(1)] | [50.43(2)] | [757.2] | [1.0036] |
| Dy | 77 | −19 | 17% | no | no | all | 3.8463(3) | 3.8726(3) | 27.237(1) | 405.7 | 1.0068 |
| Ho | 77 | −20 | 18% | no | no | all | 3.8404(6) | 3.8704(6) | 27.221(5) | 404.6 | 1.0078 |
| Er | 78 | −22 | 20% | no | no | all | 3.8366(5) | 3.8685(5) | 27.230(4) | 404.1 | 1.0083 |
| Tm | 77 | −11 | 10% | no | no | all | 3.827(1) | 3.864(1) | 27.18(1) | 401.9 | 1.0097 |

The powder diffraction pattern for $YBa_2Cu_4O_8$ showed minor amounts of Ba cuprate and an unidentified phase (peaks at 7.49, 3.09 and 3.00 Å), but no evidence to a 1-2-3 component. Because, however, the calculated intensity of the diagnostic 11.5 Å line for the Y-bearing 1-2-3 compound is very weak (4.2%), a small amount of that material in the sample would not be revealed by x-ray diffraction. However, calculated powder patterns for 1-2-3 structure phases show that the intensity of the 11.4 Å peak increases with increasing atomic number of the element substituted for Y, e.g., to a relative intensity of 33% for the Eu and Gd cases. Therefore, even minor quantities of a 1-2-3 phase should be apparent in powder diffraction patterns of the rare-earth substituted samples. The pattern for the Dy sample indicated nearly pure 1-2-4 and no 1-2-3. The Sm and Nd sample patterns, however, showed both 1-2-3 and 1-2-4.

All the compounds were bulk superconductors and showed strong Meissner diamagnetic transitions. The $T_c$'s of the different compounds vary, and are correlated with lattice parameters a and b, and with orthorhombic distortion which increases for the heavier (smaller) rare earth ions. Axial ratios b/a range from 1.004 in $SmBa_2Cu_4O_8$ to 1.010 in $TmBa_2Cu_4O_8$. Although the Ho and Y compounds have nearly identical lattice parameters, the $T_c$ of $HoBa_2Cu_4O_8$ is about 3K lower, possibly because the larger magnetic moment of Ho suppresses the coupling between the $CuO_2$ planes.

EXAMPLE 2

Eu OR Gd 2-4-7 BICRYSTALLINE COMPOUNDS

In the Eu and Gd systems, in addition to the 1-2-4 phase, an additional 2-4-7 phase was found, with alternating 1-2-3 and 1-2-4 blocks analogous to $Y_2Ba_4Cu_7O_x$.

empirical formulas $Eu_2Ba_4Cu_7O_x$ and $Gd_2Ba_4Cu_7O_x$ were prepared in exactly the same manner as described in the first example except that the pressure of oxygen used during calcining and during sintering was 30 atmospheres instead of 120 atmospheres. X-ray powder diffraction spectra of the samples showed the strong peak at the angle corresponding to a D-spacing of about 12.55 Å which is characteristic of the 2-4-7 compound, and no peaks were seen at the angles corresponding to the D-spacing of the 1-2-3 compound (11.6 Å) or of the 1-2-4 compounds (13.6 Å). Meissner diamagnetic curves indicated a large diamagnetic superconducting fraction with a critical temperature of about 40K in both cases. Small diamagnetism persisted up to about 70K indicating that a small fraction of 1-2-4 phase was also present. From the above, it could be inferred that at some synthesis pressure below 30 atmospheres but above one atmosphere the 1-2-4 phase would no longer form, and the entire sample would be 2-4-7 phase. Experiments were carried out in which other rare earth elements were substituted and calcining and sintering were carried out at 30 atmospheres pressure. X-ray powder diffraction measurements showed the presence of 1-2-4 and 2-4-7 phases and also phases with more complicated sequences of 1-2-3 and 1-2-4 phases than the simple alternation found in the 2-4-7 phase. In the case of holmium for example, phases were present with D spacings corresponding to sequences of 4 layers of the 1-2-3 structure followed by one layer of the 1-2-4 structure and sequences of 2 layers of the 1-2-3 structure followed by 3 layers of the 1-2-4 structure. Thus many new and more or less complex chemical and structural phases can be prepared by the use of this invention. All of the samples, with the exception of Nd, contained minor amounts of an unknown phase that had a characteristic diffraction peak at about 7.5 Å.

In Table 1, the superconducting temperature $T_c$ was determined by observation of bulk diamagnetism. Note that the $T_c$'s of the different compounds are significantly different, and are correlated with lattice parameters a and b, and with orthorhombic distortion which is larger for the heavier (smaller) rare earth ions. The symbol $\chi_{20K}$ represents the flux expulsion on cooling to 20K in a constant Oe field, and is expressed in units of $10^{-4}$ emu/g. The symbol $4\pi\rho\chi_{20K}$ represents the diamagnetic volume fraction. The density $\rho$ is calculated from the measured unit cell volume. The superconducting fraction may be larger, because some expelled flux will be trapped in the pores of these ceramic samples. The relative amounts of the phases were estimated from x-ray powder diffraction patterns and Reitveld refinements. To determine the lattice parameters, the Reitveld procedure was used and a sample displacement correction was refined along with the unit-cell parameters. The refinement included 1-2-3 or 2-4-7 phases when present. The unit-cell parameters found for the Dy compound did not differ significantly from those determined using a $Cr_2O_3$ internal standard.

Comparing the data in Table 1 for $YBa_2Cu_4O_8$ with that reported by Marsh, et al., referenced above, the lattice parameters are in general agreement, but with higher precision. The average value of the a and b crystallographic axes (3.855 Å) is close to that of 1-2-3 in both its orthorhombic (3.853 Å) and tetragonal (3.857 Å) variants. The axial ratio b/a=1.0080 corresponds to less than half the distortion of fully oxidized $YBa_2Cu_3O_7$ (b/a=1.017).

Phases in the polycrystalline samples were characterized by optical and electron microscopy, x-ray powder diffraction, and electron microanalysis. All phases appeared black and optically opaque, with average grain sizes no larger than one micron. Electron microanalyses of samples in the Y-Ba-Cu-O system were obtained on a JSM Model 35 scanning electron microscope, operated at 20 kV and 0.01 μA beam current with a 2.5 μm spot size. Standards included pure Cu metal, NBS microprobe standard K253 for Ba, and Y standard REE3 as described in Drake, M. J., et al., *Chem. Geol.* 10, 179 (1972). Portions of disks of the Y-Ba-Cu-O samples were embedded in epoxy cement and polished for microprobe analysis. Scanning electron microscopy of the polished surface revealed smooth areas well suited for electron microanalysis, as well as considerable intergranular porosity characteristic of ceramic superconductors.

The predominant phase in the Y-Ba-Cu-O samples was a ternary oxide with cation ratios of Y:Ba:Cu close to 1:2:4, though a few analyses yielded only 3.7 to 3.8 Cu per three of the Y/Ba. No analyses close to a 1:2:3 stoichiometry were obtained. From this it is concluded that the 2-4-8 compound was the predominant bulk superconductor in these samples. A second ternary compound, corresponding to the transparent green phase $Y_2BaCuO_5$, occurred in one point analysis. The absence of a green phase in the optical examination may imply a fine-scale mantling of the transparent 2:1:1 phase by opaque phases. In addition to the ternary compounds, occasional grains of an yttrium cuprate and a barium cuprate, both with 1:1 cation ratios, were observed.

Transmission electron microscopy (TEM), electron diffraction, and x-ray analytical electron microscopy (AEM) were performed on the yttrium compound using a Philips 420ST microscope equipped with an EDAX energy-dispersive detector and a PGT 4000 analyzer. Selected-area electron diffraction patterns and AEM analyses from numerous grains of the crushed sample confirmed the x-ray diffraction results that most of the material was well crystallized, bulk 2-4-8 structure. The data were consistent with the x-ray unit cell parameters and space group Ammm. Single crystals of the yttrium 1-2-4 phase were observed up to several tens of micrometers across. The electron diffraction patterns indicated that most of this pattern was well-ordered, though streaking parallel to the c* indicated that some crystals possessed some structural disorder affecting the periodicity of the (001) planes.

High resolution lattice images showed that at least part of the disorder resulted from the insertion of occasional layers that were either smaller or larger than the 13.6 Å (002) layers of the ideal 1-2-4 structure. Similar defects have been observed in the Bi- and Tl-based high-$T_c$ superconductors and in $YBa_2Cu_3O_{7-\delta}$, all of the prior art. In the present material, a few ordered crystals of an additional pure Y-Ba-Cu phase with layer spacing of approximately 14.6 Å also were found. In addition to these complications related to layer spacing, electron diffraction patterns and lattice images from 1-2-4 indicated that many crystals were ordered parallel to the a axis, producing the modulations and superstructures in this direction having multiples of the 3.84 Å axis repeat.

EXAMPLE 3

2-4-7 SINGLE PHASE COMPOUNDS

1. General Description

The high temperature superconductor $Y_2Ba_4Cu_7O_{15}$ was prepared in bulk by the solid state reaction method. In addition, five new analogous rare earth compounds $R_2Ba_4Cu_7O_{15}$ (R=Eu, Gd, Dy, Ho, Er) have been prepared. Oxygen pressures ranging from 14 to 35 bar were utilized. The oxygen pressure ranges within which each of the 2-4-7 compounds are thermodynamically stable were determined and it was found that the required $P(O_2)$ increases with rare earth radius. The $T_c$ of $Y_2Ba_4Cu_7O_{15}$ is 55K. The 2-4-7 phase shows variable oxygen stoichiometry, as would be expected since it contains blocks of 1-2-3. The effect on $T_c$ of varying the oxygen content should provide information about the roles of the 1-2-4 and 1-2-3 blocks, and the coupling between the different layers.

2. Synthesis Experiments

The $R_2Ba_4Cu_7O_{15}$ compounds (R=Y, Eu, Gd, Dy, Ho, or Er) were synthesized by solid state reaction of a stoichiometric mixture of $R_2O_3$+BaO+CuO powders (all 99.9% or better). In the case of $Y_2Ba_4Cu_7O_{15}$, the reaction was carried out at 930° C. in oxygen at a pressure $P(O_2)$ of 18.6 bar for 8 hours. This was followed by slow-cooling (5° C./min) to room temperature at the same pressure. The rare earth substituted compounds were prepared similarly, but higher temperature (980° C.) was necessary for the synthesis reaction of the lighter rare earth compounds including Eu 2-4-7, Dy 2-4-7, Y 2-4-7, and Er 2-4-7. Differing synthesis pressures were used because the 2-4-7 stability region varies with rare earth radius. In some cases, the pellets were ground and fired a second time under the same conditions to improve homogeneity and to ensure complete reaction.

3. $T_c$ and Diamagnetism

Figure 1A:
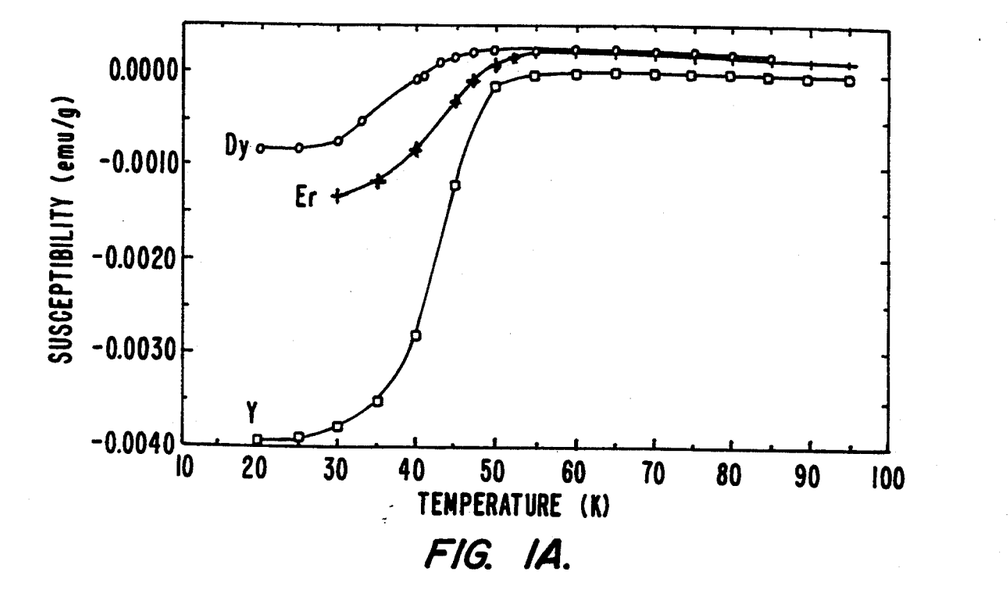
FIG. 1 is a set of Meissner susceptibility curves of superconducting compounds $R_2Ba_4Cu_7O_{15-x}$ (R=Y, Eu, Gd, Dy, Er).
Figure 1B:
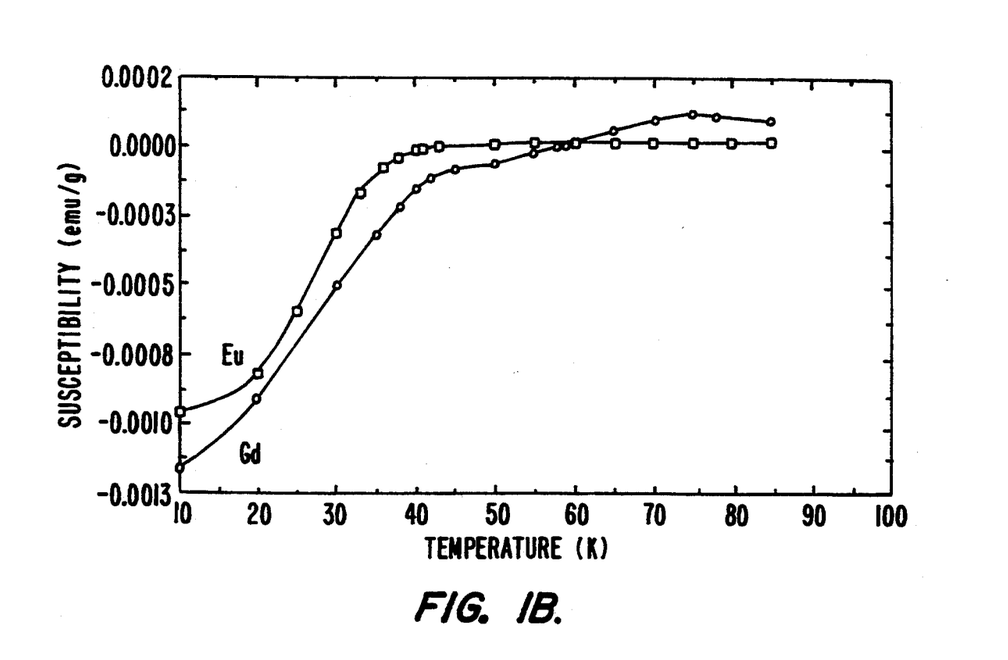
Figure 2A:
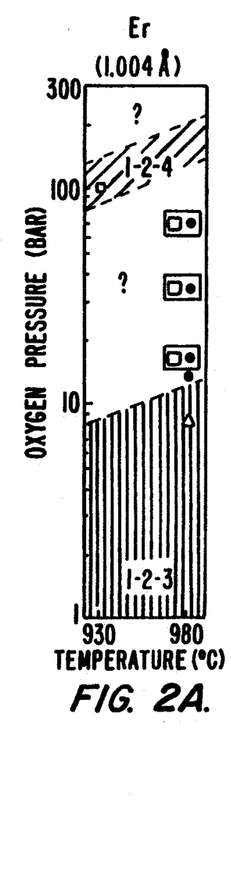
FIG. 2 is a set of partial P-T-x diagrams of superconducting phases in several rare earth R-Ba-Cu-O systems. The rare earth ionic radii are indicated. Each data point represents a different synthesis experiment.
Figure 2B:
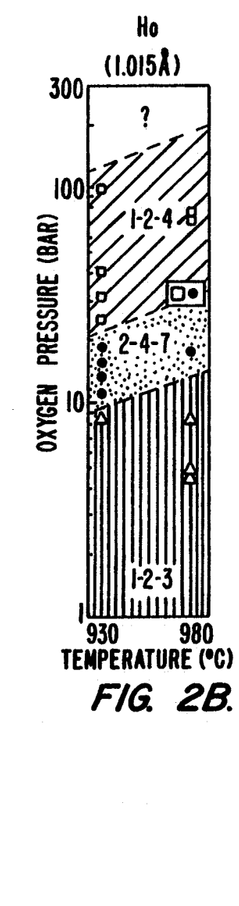
Figure 2C:
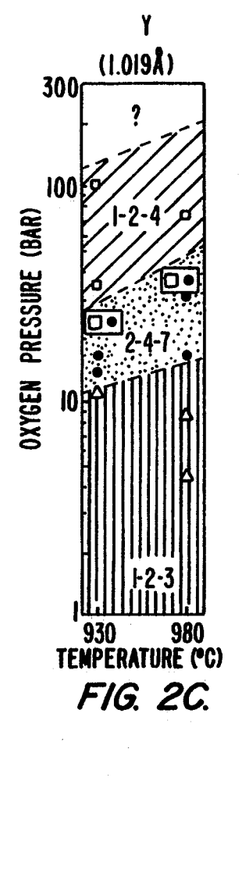
Figure 2D:
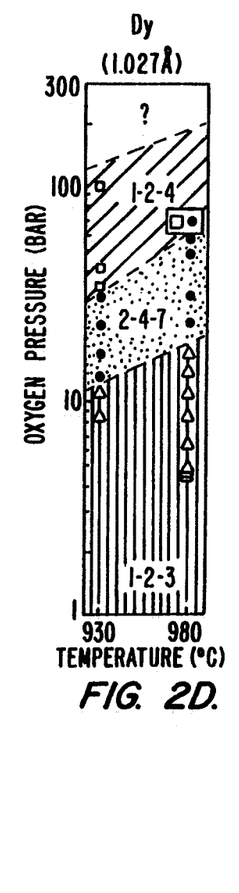
Figure 2E:
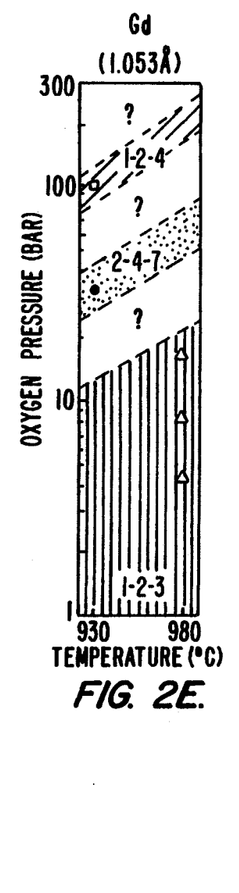
Figure 2F:
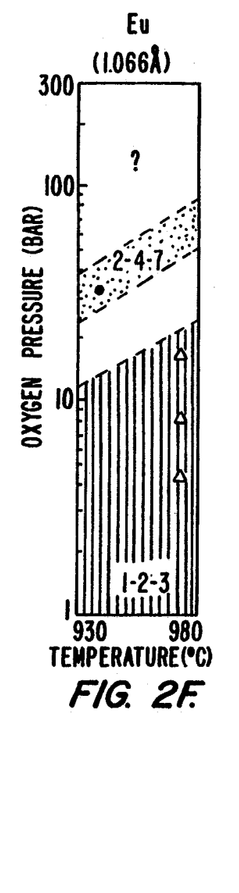
Figure 3A:
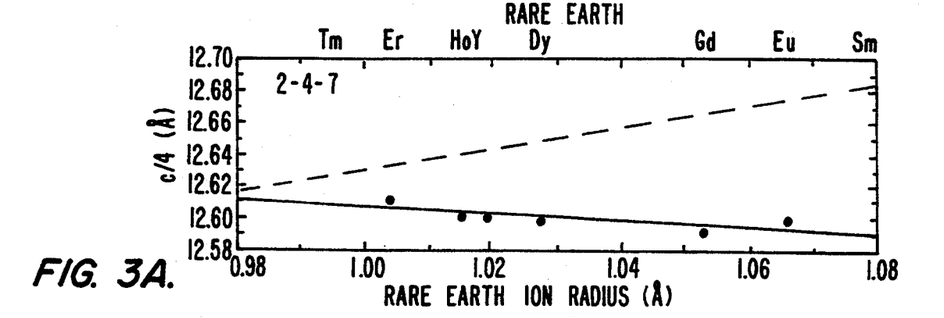
FIG. 3 illustrates dependence of a, b, and c lattice parameters of 2-4-7, 1-2-4 and 1-2-3 superconductors on rare earth ion radius. The 2-4-7 parameters are shown by filled circles, and 1-2-3 and 1-2-4 are shown by open triangles and squares respectively.
Figure 3B:
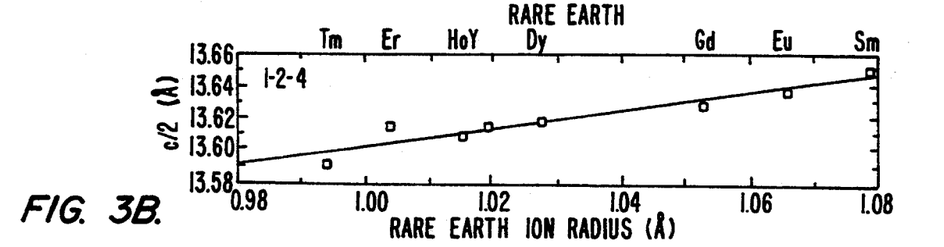
Figure 3C:
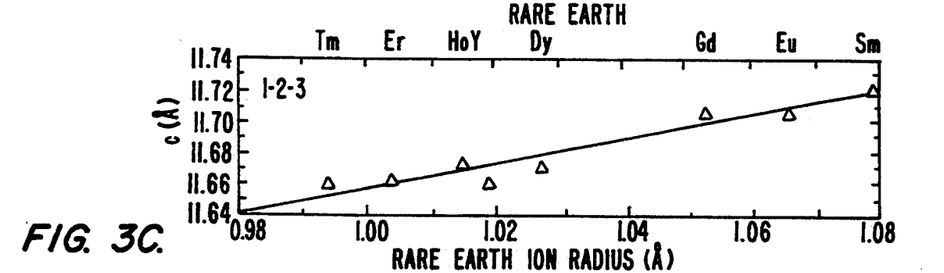
Figure 3D:
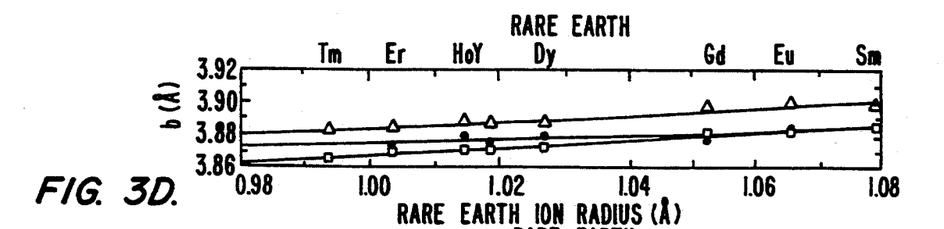
Figure 3E:
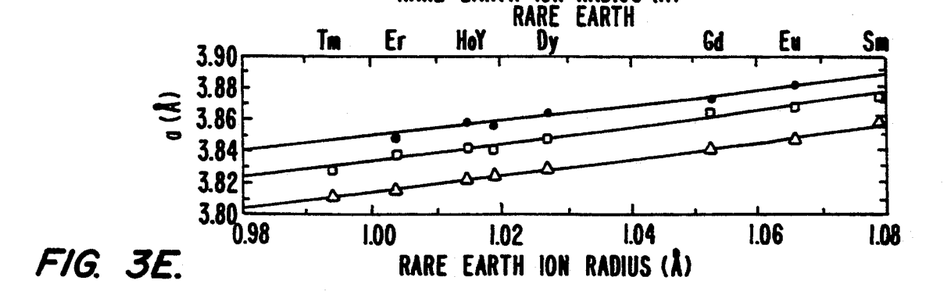

Bulk superconductivity in all samples was demonstrated by substantial Meissner diamagnetism (see Table 2 and FIG. 1), using a Quantum Design SQUID magnetometer. The transitions are strong and sharp. All samples are single phase except for Gd. The critical temperatures of the 2-4-7 compounds are lower than those of the corresponding 1-2-3 and 1-2-4 compounds. $T_c$'s range from 45 to 55K and vary with rare earth radius as do the lattice parameters (see FIGS. 3 and 4). This suggests the possibility of a large pressure dependence of $T_c$ in the $R_2Ba_4Cu_7O_{15-x}$ phase. Our samples showed no substantial diamagnetism above the onsets in the 45–55K range, except for Gd which appeared to contain some 1-2-4 phase (FIG. 1).

4. Characterization by X-ray Diffraction

All grains in the polycrystalline samples appeared black and optically opaque, with average grain sizes $\leq 2$ µm. The phase content in each case was determined by low angle X-ray diffraction (XRD) patterns. X-ray powder diffraction (XRD) was performed on a Scintag automated powder diffractometer using Cu $K_\alpha$ radiation. Diffraction patterns of the samples were examined for evidence of the superconducting phases 2-4-7, 1-2-4 and 1-2-3, as indicated by the presence of low angle peaks at d-spacings of approximately 12.5 Å, 13.6 Å and 11.7 Å, respectively. For each sample that showed the 2-4-7 structure as the major phase, full scans were taken and cell parameters were refined by the Rietveld method, assuming space group Ammm and the model structure reported in Bordet et al., Nature 334, 596 (1988). The lattice parameters are given in Table 2. In the case of $Y_2Ba_4Cu_7O_{15}$, it was found that a=3,854(1) Å, b=3,874(1) Å, c=50.40(1) Å. The powder diffraction pattern for $Y_2Ba_4Cu_7O_{15}$ showed minor amounts of CuO and an unidentified phase (peaks at 3.09 and 3.00 Å), but no characteristic peaks of 1-2-4 or 1-2-3 compounds were seen. It was concluded that the $Y_2Ba_4Cu_7O_{15}$ compound is the predominant bulk superconductor in this sample. This low angle x-ray method is less sensitive for Y compounds than for rare-earth substituted samples, where the stronger low angle peaks permit the easy identification by powder diffraction of minor quantities of 1-2-4 and 1-2-3 (see D. E. Morris et al., Phys. Res. B 39, 7347 (1989), which is incorporated herein by reference).

5. Phase Diagrams

Portions of the phase diagrams for the 1-2-3/1-2-4/2-4-7 systems with $R_2Ba_4Cu_7O_{15}$, where R=Y, Eu, Gd, Dy, Ho, and Er are given in FIG. 2. Estimated stability regions for the different phases are represented in FIG. 2 by the shaded areas. The stability region of the 2-4-7 phase is between the 1-2-3 and 1-2-4 phases, and shifts to higher oxygen pressure with larger rare earth ion size. Each point in the figure represents a different synthesis experiment. Samples which showed only a single low angle XRD peak are marked with the symbol for the corresponding phase. For mixed phase samples, both symbols are shown. The fractions of the different phases were estimated from the relative heights of the low angle XRD peaks. The phase diagrams of the Y-Ba-Cu-O and Dy-Ba-Cu-O system show that at 930° C. the 2-4-7 phase is stable only in a small range of oxygen pressure between about 12 and 30 bar. This 2-4-7 region lies between the stability regions of the 1-2-4 and 1-2-3 phases. The required $P(O_2)$ increases with temperature; at 980° C. the 2-4-7 phase is found only between 20 and 60 bar (see FIG. 2). When lighter (larger) rare earths were substituted for the Y or Dy the region of stability of 2-4-7 appeared to shift to higher pressure. This shift with rare earth ion size may explain the successful synthesis at 1 bar oxygen pressure of $Yb_2Ba_4Cu_7O_{15-x}$ by oxidation of a metallic precursor, and of $ErBa_2Cu_4O_8$ and of $HoBa_2Cu_4O_8$ at 1 bar oxygen pressure by solid state reaction starting with nitrates. Based on the data for Dy and Y in FIG. 2, the pressure range of stability of 2-4-7 appears to become narrower as the synthesis temperature is decreased from 980° C. to 930° C. At still lower temperatures the 2-4-7 region may pinch off for ions larger than Yb, leaving only the 1-2-4 and 1-2-3 phases at 1 bar oxygen pressure.

6. Variable Oxygen Stoichiometry of 2-4-7

Preliminary oxygen content studies were performed on $Dy_2Ba_4Cu_7O_{15}$ using a thermograviometric analyzer. Samples were heated in 1 bar $O_2$ and in $N_2$ together and rapid and reversible oxygen loss was observed above ~400° C. As expected, $T_c$ shifted downward with decreased oxygen content in the 2-4-7 compound. Oxygen variation provides an additional tool for studying superconductivity in the 2-4-7 compounds, and varying the anisotropy of normal state transport and superconducting parameters.

7. Correlation of Structural Parameters of 2-4-7/1-2-4/1-2-3 with $T_c$

The $T_c$'s of the 2-4-7 phase are lower than those of the corresponding 1-2-4 and 1-2-3 compounds. The lattice parameter values in FIG. 3 for the 1-2-4 and 1-2-3 were taken from J. M. Tarascon et al., Phys. Rev. B 36, 226

TABLE 2

Superconducting and structural parameters of $R_2Ba_4Cu_7O_{15-x}$ compounds

| | Superconducting Parameters[a] | | | | Lattice Parameters of 2-4-7 phase | | | | | Synthesis conditions | |
|---|---|---|---|---|---|---|---|---|---|---|---|
| R= | ion radius | $T_c$(K.) | $\chi_{20 K}$.[b] | $4\pi\rho\chi_{20 K}$.[c] | a(Å) | b(Å) | c(Å) | V(Å$^3$) | b/a | T(°C.) | PO$_2$ |
| Eu[d] | 1.066 | 45 | −10 | 8% | 3.879(2) | 3.886(1) | 50.39(3) | 759.6 | 1.0018 | 980 | 35 |
| Gd[d] | 1.053 | 45 | −13 | 10% | 3.872(1) | 3.879(1) | 50.36(2) | 756.4 | 1.0018 | 930 | 35 |
| Dy | 1.027 | 50 | −8 | 6% | 3.864(1) | 3.879(1) | 50.39(1) | 755.3 | 1.0038 | 980 | 30 |
| Y | 1.019 | 55 | −40 | 32% | 3.854(1) | 3.874(1) | 50.40(1) | 752.5 | 1.0052 | 980 | 20 |
| Ho | 1.015 | 55 | −18 | 14% | 3.857(1) | 3.879(1) | 50.40(1) | 754.0 | 1.0057 | 930 | 15 |
| Er | 1.004 | 55 | −15 | 12% | 3.847(1) | 3.873(1) | 50.44(1) | 751.5 | 1.0068 | 980 | 14 |

[a]By observation of flux expulsion. Note that the $T_c$'s of the different compounds are significantly different, and are correlated with lattice parameters a and b, and with orthorhombic distortion which is larger for the heavier (smaller) rare earth ions
[b]Flux expulsion on cooling to 20 K. in a constant 6 Oe field, in units of $10^{-4}$ emu/g.
[c]Diamagnetic volume fraction. The density $\rho$ is calculated for the measured unit cell volume. The superconducting fraction may be larger, becasue some expelled flux will be trapped in the pores of these ceramic samples.
[d]Sample contained 1-2-4 as impurity phase. Lattic parameters were obtained by simultaneous Rietvelt refinements of both phases.

(1987) and D. E. Morris et al., Phys. Rev. B 39, 7347 (1989), respectively. It is interesting to compare the differences in lattice parameters of 2-4-7, 1-2-4 and 1-2-3, since some of these differences may be related to the disparity in $T_c$'s. The formal average copper valence (FACV) in the 2-4-7 compounds is 2.28, intermediate between 1-2-4 (FACV=2.25) and 1-2-3 (FACV=2.33), so an intermediate hole concentration and $T_c$ might be expected. However, the a and c lattice parameters of 2-4-7 are not intermediate between those of 1-2-3 and 1-2-4 nor are the basal plane area or the orthorhombic distortion parameters. If the reduced $T_c$ of 2-4-7 is due to lower hole concentration, the antibonding Cu-O orbitals will be more filled, resulting in longer bonds in the $CuO_2$ planes, which may be reflected in the a and b lattice parameters.

The basal plane areas (a·b) of the 2-4-7 compounds are considerably larger (~0.6%) than in the corresponding 1-2-4 or orthorhombic 1-2-3 compounds, which have nearly the same a·b (see FIG. 4). The orthorhombic distortion of each in the 2-4-7 compounds is much less than that in the corresponding 1-2-4 compounds, while the distortion and $T_c$ of fully oxygenated 1-2-3 is still higher. For all the 2-4-7compounds, the c axis is shorter than the sum of the c axes of the corresponding 1-2-4 and 1-2-3 compounds (see FIG. 3), and this may indicate shorter apical oxygen distance. This, and the larger a·b area, suggest smaller hole concentration in the $CuO_2$ planes, which may also explain the relatively low $T_c$'s of the 2-4-7 compounds.

It should be pointed out, however that estimates of changes in bond lengths from changes in a, b and c do not take into account possible changes in bond angles such as those resulting from the "puckering" of the $CuO_2$ layers. It is known that the average Cu-O-Cu bond angle in the $CuO_2$ planes of 1-2-4 is 165.7°, somewhat larger than in 1-2-3 (163.8°). If the bond angles increase to 168.8° in 2-4-7, the larger basal plane area of 2-4-7 can be accounted for without increase in bond lengths. Precise atomic positions, necessary to determine bond lengths and angles, can be obtained by neutron diffraction.

8. Variation of Lattice Parameters and $T_c$ with Rare Earth Substitution

Figure 4A:
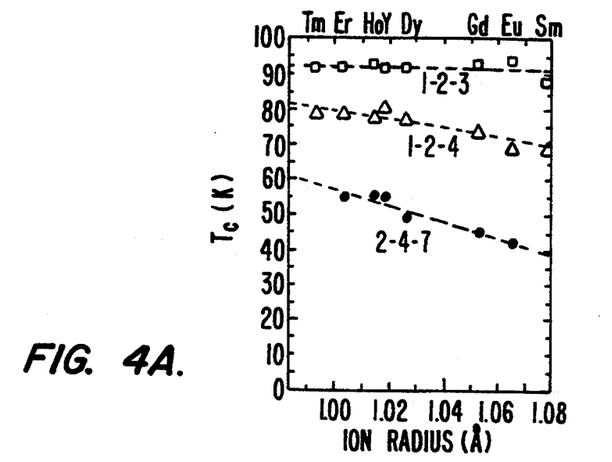
FIG. 4a is a plot of $T_c$ vs. Rare Earth ion radius. Symbols and references are the same as in FIG. 3.

The $T_c$ of 2-4-7 decreased with increasing ion size (FIG. 4a). This behavior is also found in 1-2-4, but not in 1-2-3 where $T_c$ was constant or increased slightly with ion size. When rare earths with larger radius (Gd, Eu) were substituted for Y in the 2-4-7 structure, the a and b parameters increased with ion radius, but c decreased, in marked contrast to the corresponding 1-2-4 and 1-2-3 compounds (see FIG. 3). The decreasing c suggests progressively shorter apical oxygen distances in the 2-4-7 compounds with increasing rare earth ion size (See FIG. 4), possibly indicating decreasing hole concentration in the $CuO_2$ planes of these compounds, whose $T_c$'s are found to progressively decrease (FIG. 4a).

Figure 4B:
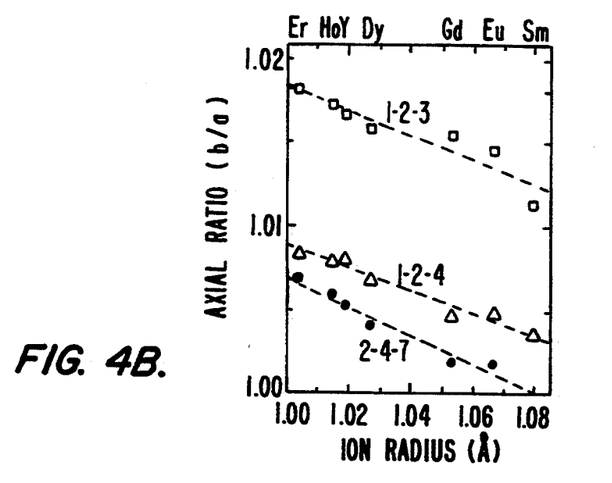
FIG. 4b is a plot of orthorhombic distortion of the 1-2-3, 1-2-4 and 2-4-7 compounds vs. rare earth radius.
Figure 4C:
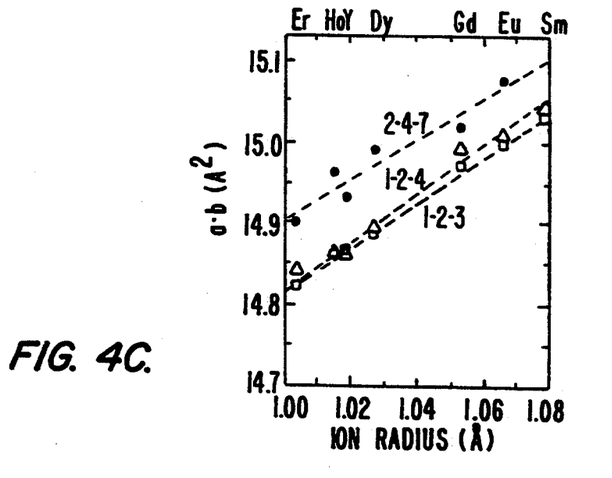
FIG. 4c is a plot of basal plane areas (a·b) vs. rare earth ion radius.

The basal plane area (a·b) of 2-4-7 increases with rare earth ion size, as in 1-2-4 and 1-2-3, and is consistently about 0.6% larger for the 2-4-7 phase in all the rare earth systems (FIG. 4b). Orthorhombic distortion of the 2-4-7 phase was small and decreased rapidly as rare earth size increased (FIG. 4c). The distortion reaches a very small value for Eu 2-4-7, and extrapolated to zero at Sm 2-4-7, whose attempted synthesis was unsuccessful.

In short, the low $T_c$'s of the 2-4-7 compounds are accompanied by anomalous basal plane areas and orthorhombic distortions, in the sense that they are not intermediate between those of 1-2-3 and 1-2-4 as expected. The a and b lattice parameters of 2-4-7 increase with rare earth size as expected, but c decreases. The 2-4-7, 1-2-4 and 1-2-3 phases offer three families of cuprate superconductors with incremental variation in structure and properties, which may be useful in testing theories of high temperature superconductivity.

The foregoing is offered primarily for illustrative purposes. It will be readily apparent to those skilled in the art that substitutions, modifications and variations in the procedures and materials disclosed above may be made without departing from the spirit and scope of the invention.

What is claimed is:

1. A method for producing an oxide, high temperature superconductor material by a solid state method under production conditions comprising reacting a plurality of starting materials in an oxygen partial pressure exceeding 2 atm., said starting materials consisting essentially of a mixture of compounds which are themselves not high-temperature superconductors which combine to form said high temperature superconductor at said production conditions.

2. A method of claim 1, wherein said starting materials comprise a rare earth element containing compound and at least one group II element selected from the group consisting of Cd, Mg, Ca, Sr, and Ba, said starting materials having a stoichiometry of rare earth elements to the sum of said at least one group II elements which is different from said superconducting material.

3. A method of claim 1, wherein said starting materials comprise an oxide of a rare earth element.

4. A method of claim 1, wherein said starting materials comprise an oxide of a metallic element.

5. A method of claim 1, wherein said starting materials are combined in relative amounts such that the stoichiometric ratio of metallic elements is approximately the same as that of said superconductor material.

6. A method of claim 1, wherein said starting materials comprise a powdered material.

7. A method of claim 1, wherein said starting materials do not include any high temperature superconductor compounds.

8. A method of claim 1, wherein said superconductor material is selected from the group consisting of:
   (a) 1-2-3 compounds;
   (b) 2-4-7 compounds; and
   (c) 1-2-4 compounds.

9. A method of claim 1, wherein said oxygen partial pressure is greater than about three atmospheres.

10. A method of claim 1, wherein said solid state method reaches a temperature of at least about 500° C.

11. A method of claim 1, wherein said superconductor material is substantially pure.

12. A method of claim 1, wherein said superconductor material is in polycrystalline bulk ceramic form.

13. The method as recited in claim 1 wherein said pressure exceeds 3 atmospheres.

14. The method as recited in claim 1 wherein said pressure exceeds 10 atmospheres.

15. The method as recited in claim 1 wherein said pressure exceeds 60 atmospheres.

16. A method of claim 1 further comprising the step of sintering said high temperature superconductor in oxygen at about the same temperature, pressure and time schedule used in the reaction.

* * * * *